(12) United States Patent
Nantz et al.

(10) Patent No.: US 8,218,608 B2
(45) Date of Patent: Jul. 10, 2012

(54) SELF-TUNING TRANSMITTER

(75) Inventors: John S. Nantz, Brighton, MI (US);
Qingfeng Tang, Novi, MI (US); Riad Ghabra, Dearborn Heights, MI (US);
Ronald O. King, Brownstown, MI (US);
Bruce Conner, Ann Arbor, MI (US);
Art Turovsky, Southfield, MI (US);
Keith Walker, Redford, MI (US);
Thomas Bejster, Dearborn, MI (US)

(73) Assignee: Lear Corporation, Southfield, MI (US)

( * ) Notice: Subject to any disclaimer, the term of this patent is extended or adjusted under 35 U.S.C. 154(b) by 2505 days.

(21) Appl. No.: 10/218,975

(22) Filed: Aug. 14, 2002

(65) Prior Publication Data

US 2003/0053529 A1 Mar. 20, 2003

Related U.S. Application Data

(60) Provisional application No. 60/317,210, filed on Sep. 5, 2001.

(51) Int. Cl.
*H04B 1/38* (2006.01)

(52) U.S. Cl. ....... 375/219; 375/295; 375/316; 340/5.71; 455/92

(58) Field of Classification Search .................. 375/219, 375/326, 327, 344, 319, 295, 316; 340/825.69, 340/5.71; 455/164.2, 182.2, 182.3, 192.2, 455/92
See application file for complete search history.

(56) References Cited

U.S. PATENT DOCUMENTS

| 5,614,891 | A | | 3/1997 | Zeinstra et al. |
| 5,699,054 | A | | 12/1997 | Duckworth |
| 5,699,055 | A | | 12/1997 | Dykema et al. |
| 5,987,085 | A | * | 11/1999 | Anderson .................. 375/374 |
| 6,021,319 | A | | 2/2000 | Tigwell |
| 6,049,289 | A | | 4/2000 | Waggamon et al. |
| 6,072,404 | A | * | 6/2000 | Nolan et al. ............ 340/825.69 |
| 6,091,343 | A | | 7/2000 | Dykema et al. |
| 6,131,019 | A | | 10/2000 | King |
| 6,181,255 | B1 | | 1/2001 | Crimmins et al. |
| 6,249,673 | B1 | * | 6/2001 | Tsui .............................. 455/92 |
| 6,265,987 | B1 | | 7/2001 | Wang et al. |
| 6,701,140 | B1 | * | 3/2004 | Stine ........................... 455/260 |

* cited by examiner

*Primary Examiner* — Sam K Ahn
*Assistant Examiner* — Leila Malek
(74) *Attorney, Agent, or Firm* — Brooks Kushman P.C.

(57) ABSTRACT

A self-tuning duplicating transceiver is provided. The transceiver includes a microprocessor, a transmitter and a receiver. The transmitter includes an electrically tunable radio frequency oscillator, and the receiver includes a counter for determining an edge count associated with a received signal. The microprocessor is programmed to receive an unknown signal with the receiver and use the counter to determine the edge count thereof, and electrically tune the transmitter oscillator to a carrier frequency corresponding to the edge count for the unknown signal.

3 Claims, 1 Drawing Sheet

SELF-TUNING TRANSMITTER

This application claims the benefit of U.S. provisional application Ser. No. 60/317,210 filed on Sep. 5, 2001.

BACKGROUND OF THE INVENTION

1. Field of the Invention

The present invention relates to wireless remote control systems, and more particularly, to a transceiver and method of determining a frequency and coding of a signal transmitted by a remote transmitter unit for storage and subsequent retransmission on demand by the transceiver.

2. Background Art

Some existing wireless systems are found in U.S. Pat. Nos. 5,614,891; 5,699,054; 5,699,055; 6,021,319; 6,049,289; 6,072,404; 6,091,343; 6,131,019; 6,181,255; 6,249,673; and 6,265,987.

SUMMARY OF THE INVENTION

In accordance with one aspect, the present invention provides an arrangement for periodic self-tuning of a radio/microwave frequency oscillator in any receiver or transmitter application. The oscillator can be of any suitable type, for example, Colpits, Clapp, Wheatly, Hartly, etc., and operate in any desired frequency range. This oscillator can be of a discrete sort, or an integrated design such as the types used with a Phase Lock Loop (PLL) transmitter IC. Variation of the tuning frequency can be carried out using any known approach, such as a Varactor diode (VCO), or electronic variable capacitors.

In accordance with another aspect, the present invention provides a receiver having a counter arrangement for allowing the receiver to cost-effectively determine a frequency of a received signal. A pre-scaler can be used to facilitate the accuracy of the counter arrangement.

In accordance with another aspect, the present invention provides a transceiver arranged to feedback a transmitted signal to the receiver (via a receiving antenna) to allow fine tuning of the transmit frequency.

Known arrangements for maintaining frequency stability in a radio frequency or microwave frequency (RF or MF) oscillator use a crystal or resonator type structure. However, such arrangements only tend to have limited stability over time. With the present invention, automatic tuning is achieved over any preset interval to ensure long term frequency accuracy irrespective of environmental variations by using a programmed microprocessor connected to the transmitter and the receiver.

DETAILED DESCRIPTION OF THE PREFERRED EMBODIMENT

Figure 1:
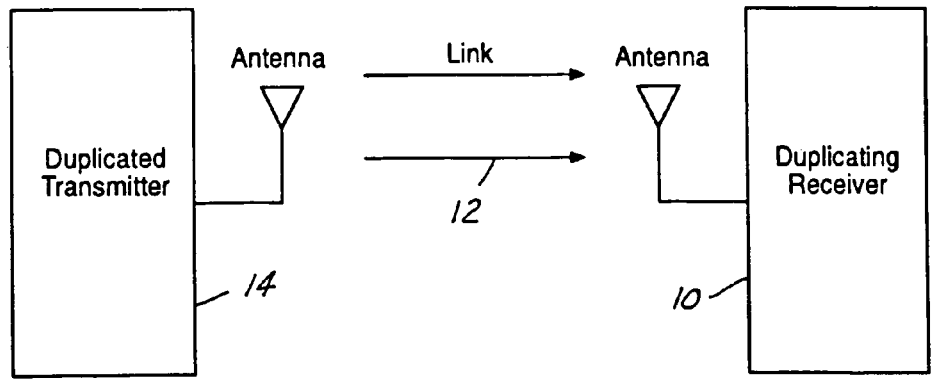
FIG. 1 is a block diagram illustrating a remote transmitter unit and a duplicating receiver in accordance with the present invention.

As shown in FIG. 1, the present invention provides a duplicating receiving device 10 that can be selectively placed into a learning mode allowing the receiver to determine and learn the incoming frequency of a signal 12 transmitted by a remote transmitter unit 14 to be duplicated. As described below in connection with FIG. 2, an exemplary embodiment of receiving device 10 includes an arrangement for storing the learned frequency information, as well as the data content of the transmitted signal, in a memory. The stored frequency information can then be used to self tune an on-board transmitter. The on-board transmitter will then be able to duplicate the same signal, for example, coding and frequency, when desired. This allows the duplicating transceiver to emulate the duplicated transmitter unit by retransmitting the same data and frequency as the original transmitter unit.

Figure 2:
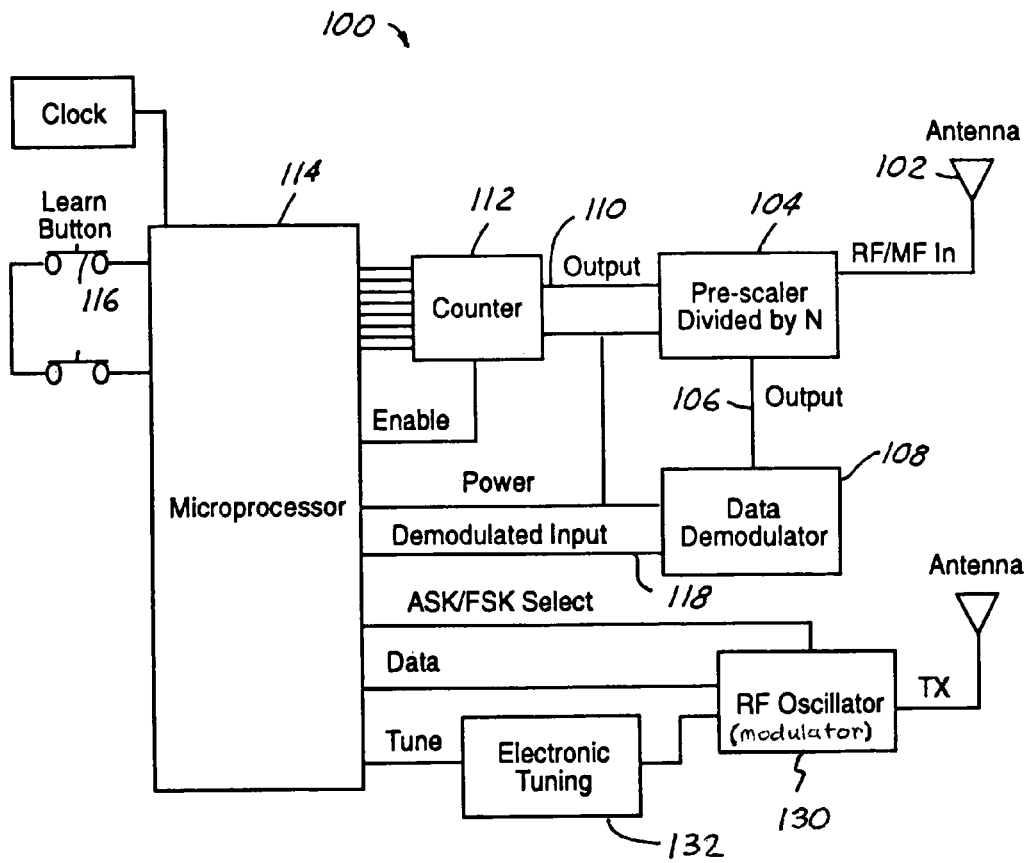
FIG. 2 is a block diagram of a duplicating transceiver in accordance with an exemplary embodiment.

Referring now to FIG. 2, an exemplary embodiment of a duplicating transceiver 100 is shown. Transceiver 100 includes a receiving antenna element 102 having an output fed to a pre-scaler 104. Pre-scaler 104 is arranged to divide the frequency of a received signal by a predetermined factor N. The pre-scaler 104 provides an output 106 to a data demodulator 108, and an output 110 to a counter 112. Data demodulator 108 operates in accordance with known demodulation principles to demodulate the data content from the received signal.

This same device will either compare the received RF/MF frequency information received to a look-up table within the microprocessor to determine the exact frequency it should be and tune the on board transmitter to this frequency, or it will simply take the RF/MF frequency data as it is received and re-transmit this information at the frequency received. This device can be used to sense if the received data was of an amplitude shift keyed (ASK) or frequency shift keyed (FSK) format and re-transmit the data in the same ASK/FSK format.

After this device has determined what carrier frequency it needs to re-transmit, it can also store the data carried by the carrier frequency for re-transmissions, or it can look at this data and compare it to data stored inside the processor to determine what it should be and re-transmit the prestored data from its memory in place of the data received. This is useful if the incoming data is of a rolling code or encrypted type.

The preferred method for achieving this auto-frequency learn and auto frequency re-transmission is as follows:

Step 1: The transmitter 14 that is intended to be duplicated is placed very close to duplicating receiver 10 as in FIG. 1.

Step 2: Circuit 100 is placed into a learn mode by the activation of a switch 116 as in FIG. 2.

Step 3: When the learn switch 116 has been activated, the transmitter intended for duplication is continuously activated.

Step 4: The data sent by this transmitter is received by the receive portion of circuit 100. The receive portion is a prescaler 104 that takes the incoming frequency divides it by any number then outputs the results. These results will be passed on to two blocks of the circuit: the first to learn the carrier frequency, the second to learn the data on the carrier frequency. The portion that learns the carrier frequency consists of a counter 112 that when enabled by the microprocessor 114, will count the edges of the incoming signal for a pre-determined period of time. This value will be used to determine the frequency of the carrier.

Step 5: After the carrier is determined, the microprocessor 114 will monitor the demodulated data input 118 to determine the data type, period and modulation format, then store it in memory. Once this is accomplished, the user will be instructed by the unit (LED or other means) that the process is complete.

Step 6: At this point, the unit will make a decision to re-measure the transmitter intended for duplication if it did not recognize the data information recorded in step 5. This will instruct the user to repeat the continuously transmit mode to verify that the data received the first time is constant or changing. If it is constant (fixed code), the user will be notified that the process was a success by LED or other visual means. If the data is changing (Rolling or Encrypted type that is not pre-stored in the circuits memory), the user will be notified that the system cannot be programmed to that particular transmitter, again by LED or other visual means.

Step 7: Once the circuit determines that it has a successful learn, it will turn on the on board transmitter and start transmitting. The transmitter is composed of RF oscillator 130 that receives data and ASK/FSK select inputs to function as a modulator. It will at the same time turn on the same prescaler used in the learn section described earlier and monitor the number of edges seen by the transmitter. The microprocessor will then electronically tune (electronic tuning 132) the transmitter until the number of edges seen match the number of edges determined during the learn section of the transmitter intended for duplication. Once the number of edges match, the tuning setting is stored and fixed in memory. This is how the self tuning of the transmitter is accomplished. This process can be repeated periodically automatically if chosen to do so in software.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A self-tuning duplicating transceiver comprising:
a microprocessor;
a transmitter directly connected to the microprocessor and including a radio frequency oscillator capable of being electrically tuned to a carrier frequency within a range of frequencies, the transmitter further including a transmitter antenna; and
a receiver directly connected to the microprocessor and including a counter for determining an edge count associated with a received signal and indicative of a received signal carrier frequency, the receiver further including a receiver antenna separate from the transmitter antenna, wherein the receiver is not directly connected to the transmitter;
a prescaler that divides the received signal prior to introduction of the received signal to the counter,
wherein the microprocessor is programmed to, on demand by a user, receive an unknown signal with the receiver and use the counter to determine the edge count thereof, store the edge count for the unknown signal, and electrically tune the transmitter oscillator to a carrier frequency corresponding to the edge count for the unknown signal; and
wherein the microprocessor is further programmed to further electrically tune the transmitter oscillator by periodically repeating the following:
transmitting a new signal at the carrier frequency corresponding to the edge count for the unknown signal, receiving the new signal and using the counter to determine the edge count thereof, further electrically tuning the transmitter oscillator to match the new signal edge count to the unknown signal edge count, and storing a tuning setting for the transmitter.

2. The transceiver of claim 1 further comprising:
a demodulator at the receiver that demodulates the received signal and provides data to the microprocessor; and
a modulator at the oscillator that modulates data from the microprocessor onto the transmitted signal.

3. The transceiver of claim 2 wherein the microprocessor is further programmed to use the demodulator to learn the data in the unknown signal, and use the modulator to modulate the learned data onto transmitted signals.

* * * * *